(12) United States Patent
Danilov et al.

(10) Patent No.: US 11,349,501 B2
(45) Date of Patent: May 31, 2022

(54) MULTISTEP RECOVERY EMPLOYING ERASURE CODING IN A GEOGRAPHICALLY DIVERSE DATA STORAGE SYSTEM

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 156 days.

(21) Appl. No.: 16/803,920

(22) Filed: Feb. 27, 2020

(65) Prior Publication Data

US 2021/0273660 A1   Sep. 2, 2021

(51) Int. Cl.
*H03M 13/37*    (2006.01)
*H03M 13/00*    (2006.01)
*G06F 11/10*    (2006.01)
*G06F 11/00*    (2006.01)
*G06F 11/14*    (2006.01)
*G06F 16/182*   (2019.01)

(52) U.S. Cl.
CPC ....... *H03M 13/373* (2013.01); *G06F 11/1464* (2013.01); *G06F 16/182* (2019.01)

(58) Field of Classification Search
CPC . H03M 13/373; G06F 16/182; G06F 11/1464
See application file for complete search history.

(56) References Cited

U.S. PATENT DOCUMENTS

| 10,642,688 | B2 * | 5/2020 | Danilov | ........... | G06F 3/067 |
| 2018/0181324 | A1 * | 6/2018 | Danilov | ........... | G06F 3/0631 |
| 2020/0409582 | A1 * | 12/2020 | Danilov | ........... | G06F 3/0644 |
| 2021/0218420 | A1 * | 7/2021 | Danilov | ........... | H03M 13/293 |

* cited by examiner

*Primary Examiner* — Justin R Knapp
(74) *Attorney, Agent, or Firm* — Amin, Turocy & Watson, LLP

(57) ABSTRACT

Multistep recovery of chunk fragments of a peer group employing hierarchical erasure coding for geographically diverse data storage protection is disclosed. A peer group of chunks can employ zone-level erasure coding of chunks that can each employ chunk-level erasure coding. In a first iteration, fragment recovery can be performed across peer group chunks based on the zone-level erasure coding. Subsequently, the first iteration can perform recovery of other fragments within a chunk based on the chunk-level erasure coding. Where additional fragments are to be recovered, subsequent iterations can be performed. The disclosed multistep recovery can enable recovery of fragments that would typically have been considered unrecoverable via conventional techniques. Additionally, multistep recovery can enable recovery of fragments across a peer group of chunks that can be more computing resource efficient than recovery of chunks across the peer group of chunks.

20 Claims, 10 Drawing Sheets

MULTISTEP RECOVERY EMPLOYING ERASURE CODING IN A GEOGRAPHICALLY DIVERSE DATA STORAGE SYSTEM

TECHNICAL FIELD

The disclosed subject matter relates to data recovery and, more particularly, to data recovery in a geographically diverse storage system that convolves chunks and that employs erasure coding techniques to protect fragments of stored chunks.

BACKGROUND

Conventional data storage techniques can employ convolution and deconvolution of data to conserve storage space. As an example, convolution can allow data to be packed or hashed in a manner that uses less space that the original data. Accordingly, a convolution of first data and second data, etc., can typically be de-convolved to the original first data and second data. Moreover, other conventional data storage techniques can employ erasure coding to protect stored data. One use of data storage is in bulk data storage.

DETAILED DESCRIPTION

Figure 1:
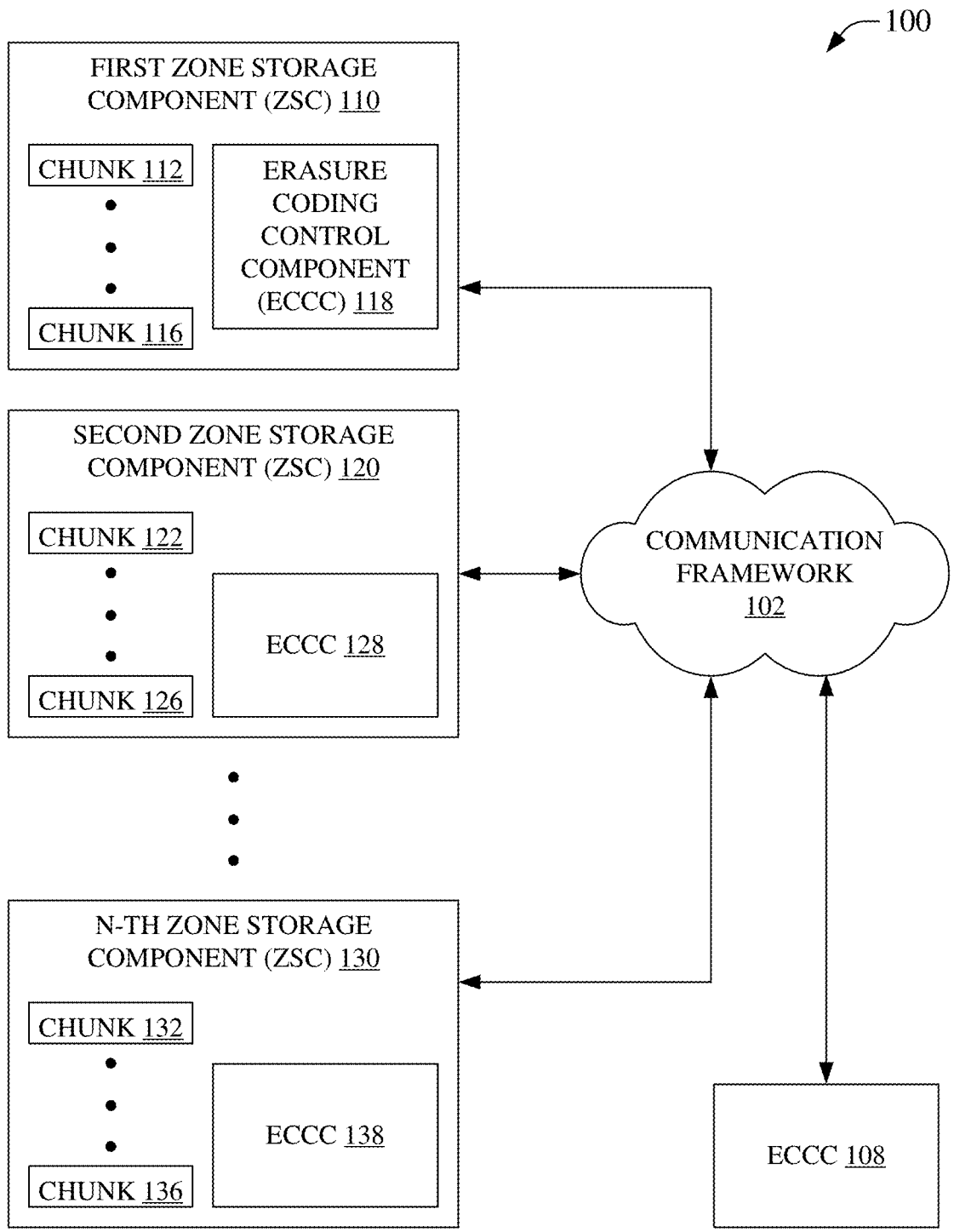
FIG. 1 is an illustration of an example system that can facilitate erasure coding for geographically diverse storage, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ convolution and deconvolution to conserve storage space. As an example, convolution can allow data to be packed or hashed in a manner that uses less space that the original data. Moreover, convolved data, e.g., a convolution of first data and second data, etc., can typically be de-convolved to the original first data and second data. One use of data storage is in bulk data storage. Examples of bulk data storage can include networked storage, e.g., cloud storage, for example ECS offered by Dell EMC, formerly known as Elastic Cloud Storage by Dell EMC. Bulk storage can, in an aspect, manage disk capacity via partitioning of disk space into blocks of fixed size, frequently referred to as data chunks, chunks, etc., for example a 128 MB chunk, etc. Chunks can be used to store user data, and the chunks can be shared among the same or different users, for example, one chunk may contain fragments of several user objects. A chunk's content can generally be modified in an append-only mode to prevent overwriting of data already added to the chunk. As such, when a typical chunk is determined to be 'full enough,' it can be sealed so that the data therein is generally not available for further modification, e.g., the chunk can be designated as immutable. These chunks can be then stored in a geographically diverse manner to allow for recovery of the data where a first copy of the data is destroyed, e.g., disaster recovery, etc. Chunks from a data storage device, e.g., 'zone storage component' (ZSC), 'zone storage device' (ZSD), etc., located in a first geographic location, hereinafter a 'zone', etc., can be stored in a second zone storage device that is located at a second geographic location different from the first geographic location. This can enable recovery of data where the first zone storage device is damaged, destroyed, offline, etc., e.g., disaster recovery of data, by accessing the off-site data from the second zone storage device.

In an aspect, the presently disclosed subject matter can include 'zones'. A zone can correspond to a geographic location or region. As such, different zones can be associated with different geographic locations or regions. As an example, Zone A can comprise Seattle, Wash., Zone B can comprise Dallas, Tex., and, Zone C can comprise Boston, Mass. In this example, where a local chunk from Zone A is replicated in Zone C, an earthquake in Seattle can be less likely to damage the replicated data in Boston. Moreover, a local chunk from Dallas can be convolved with the local Seattle chunk, which can result in a compressed/convolved chunk, e.g., a partial or complete chunk, which can be stored in Boston. As such, either the local chunk from Seattle or Dallas can be used to de-convolve the partial/complete chunk stored in Boston to recover the full set of both the Seattle and Dallas data chunks. The convolved Boston chunk can consume less disk space than the sum of the separate Seattle and Dallas local chunks. As an example, "exclusive or" convolution, hereinafter 'XOR', '⊕', etc., can be employed to convolve the Seattle and Dallas chunks to form the Boston chunk, e.g., $C = A1 \oplus B1$, where $A1$ is a replica of the Seattle local chunk, $B1$ is a replica of the Dallas local chunk, and $C$ is the convolution of $A1$ and $B1$. In some embodiments, a protection set can be distributed across zones of a geographically diverse storage system to provide ruggedness of stored data, e.g., an erasure coding (EC) of data can be used to determine a protection set that can facilitate recovery of protected data and the portions of the protection set can be stored in a diverse manner in a geographically diverse storage system to provide ruggedness. Of further note, the disclosed subject matter can further be employed in more or fewer zones, in zones that are the same or different than other zones, in zones that are more or less geographically diverse, etc. As an example, the disclosed subject matter, in some embodiments, can be applied to data of a single disk, memory, drive, data storage device, etc., without departing from the scope of the disclosure, e.g., the zones in some embodiments can represent different logical areas of the single disk, memory, drive, data storage device, etc. Moreover, it will be noted that convolved chunks can be further convolved with other data, e.g., $D=C1 \oplus E1$, etc., where E1 is a replica of, for example, a Miami local chunk, E, C1 is a replica of the Boston partial chunk, C, from the previous example and D is an XOR of C1 and E1 located, for example, in Fargo.

In an aspect, chunks in disparate geographic locations can provide for recovery of data. Continuing a previous example, the Fargo chunk, D, can be de-convolved into C1 and E1 based on either C1 or D1; the Miami chunk, C, can be de-convolved into A1 or B1 based on either A1 or B1; etc. Continuing another previous example, remaining portions of a protection set can be employed to recover other less accessible portions of the protection set, e.g., portions in Fargo, et al., can be used to recover less accessible portions in Miami, etc.

In an aspect, a ZSC can comprise one or more data storage components that can be communicatively coupled, e.g., a ZSC can comprise one data store, two or more communicatively coupled data stores, etc. In an aspect, this can allow replication of data in the ZSC and can provide data redundancy in the ZSC, for example, providing protection against loss of one or more data stores of a ZSC. As an example, a ZSC can comprise multiple hard drives and a chunk can be stored on more than one hard drive such that, if a hard drive fails, other hard drives of the ZSC can comprise the chunk, or a replicate of the chunk. As such, there can be redundancy in a zone and other redundancy between zones.

Recovery of data can be computer resource intensive, e.g., processor, memory, network, storage, etc., intensive. As an example, loss of access to data of a Seattle zone can result in recovery of chunks via other zones as part of recovering the Seattle zone. The example recovery can comprise moving chunks between the other zones to enable the recovery at the other zones, use of processor time in the other zone, use of memory in the other zones, use of storage space in the other zones, etc. As such, it can be desirable to reduce the burden of a recovery process over many zones, e.g., it can be desirable that many processors, memories, storage devices, networks, etc., access less data to recover data. As an example, accessing a portion of a chunk, rather than a whole chunk, can be faster and less computer resource intensive, e.g., less network bandwidth, lower processor loading, less memory consumption, etc. In some geographically diverse storage systems, zones can be located substantially far apart, for example a Moscow Russia zone, a Seattle USA zone, A Sao Paolo, Brazil zone, etc., so reducing the amount of data access, transfer, etc., involved in data protection can be an important factor in a successful geographically diverse storage system.

In an aspect, compression/convolution of chunks can be performed by different compression/convolution technologies. Logical operations can be applied to chunk data to allow compressed data to be recoverable, e.g., by reversing the logical operations to revert to an earlier form of chunk data. As an example, data from chunk 1 can undergo an exclusive-or operation, hereinafter 'XOR', with data from chunk 2 to form chunk 3. This example can be reversed by XORing chunk 3 with chunk 2 to generate chunk 1, etc. As another example, data from chunks A to D can be encoded into two code chunks according to a 4+2 EC scheme, such that the example protection set can comprise six chunks (two code chunks and four data chunks). This example can be reversed by employing any four of the six chunks of the protection set to recover other less accessible chunks of the protection set, e.g., chunks B, D, and the two code chunks can be used to recover chunks A and C, etc. It is noted that the disclosure is not so limited and that other operations or combinations of operations can be substituted without departing from the scope of the present disclosure, e.g., other compression, data protection, etc., technologies can be employed without departing from the disclosed subject matter. As such, all logical and/or mathematical operations for compression germane to the disclosed subject matter are to be considered within the scope of the present disclosure even where not explicitly recited for the sake of clarity and brevity.

In an aspect, use of erasure coding, e.g., instead of basic XOR techniques, etc., to protect data in a geographically diverse storage system can be beneficial, for example by reducing computer resource demands in storing, recovering, etc., data chunks or portions thereof. Historically, erasure coding was created as a forward error correction method for binary erasure channels. However, more recently early attempts have been made to use erasure coding for data protection. Generally, erasure coding can divide a data portion, into k data fragments of equal size. During erasure coding encoding operations, m coding fragments can be created, which can enable access to data of the data portion, e.g., data of a data portion that has been erasure encoded into k+m fragments can be accessible with loss of up to m fragments, for example, in a 12+4 encoding, data can still be accessed despite the loss of up to four data fragments, four coding fragments, two data and two coding fragments, etc. It can be said that the way the encoding is done can assure that a system can tolerate the loss of any m fragments. The process of generating coding fragments can be referred to as 'encoding.' The process of recovering data fragments from an encoded data portion, e.g., using available data fragments and/or coding fragments, can be termed 'decoding.'

In an aspect, erasure coding can be employed to protect data in a geographically diverse data storage system. Erasure coding can divide a data portion (D) into k data segments. During an encoding operation, m coding segments can be created. Encoding can assure that a loss of any m segments of the k+m segments can be tolerated without loss of data access. If up to m segments are lost, become inaccessible, become less accessible, etc., hereinafter simply 'lost' unless otherwise explicitly indicated otherwise, the missing segments can be restored via a decoding operation. An erasure coding protection scheme can be identified as resulting in k+m data segments, e.g., k data segment and m coding segments result for a single data portion of a protection set, e.g., for a data chunk, etc., see, for example, Chunk 351 of a zone in system 300 of FIG. 3 having k=12 and m=4 for 12 data segments and four coding segments for Chunk 351 under a 12+4 erasure coding scheme. Other erasure coding schema are also relevant, e.g., k=10 and m=2 for ten data segments and two coding segments under a 10+2 erasure coding scheme, k=4 and m=2 for four data segments and two coding segments under a 4+2 erasure coding scheme, etc.

In an aspect, erasure coding can be employed at different levels of a geographically diverse storage system, e.g., hierarchical erasure coding, etc., for example, at a zone-level to erasure encode/decode chunks between zones, e.g., a peer group of chunks can comprise $k_{zone}+m_{zone}$ chunks; at a chunk-level to erasure encode/decode chunk segments in a zone, e.g., a chunk of a peer group of chunks can comprise $k_{chunk}+m_{chunk}$ fragments; etc. In an aspect, different erasure coding schemes can be used for different levels, different chunks, etc. As an example, a 4+2 scheme, generating $k_{zone}+m_{zone}$ chunks for a peer group, can be employed at the zone-level, while a 12+4 scheme can be used at the chunk-level in a single zone to encode/decode different chunks to generate $k_{chunk}+m_{chunk}$ fragments in a chunk. Moreover, for example, chunks from zone-level erasure coding can then be chunk-level erasure coded such that the resulting data segments of the chunks of a zone can be said to have been 'doubly erasure encoded,' 'hierarchically erasure encoded,' etc., e.g., generating $k_{zone}+m_{zone}$ chunks for a peer group, wherein each chunk of the peer group has $k_{chunk}+m_{chunk}$ fragments. This can result, via a decoding operation(s), in communicating/accessing less than a full chunk for recovery of less accessible data, e.g., lost data, corrupted data, missing data, failed communication with or in a zone, etc., as is discussed in more detail herein.

Rather than simply duplicating chunks between zones of a geographically diverse data storage system, even with convolution, erasure encoding, more especially hierarchical erasure encoding, can reduce the amount of data that needs to be accessed, communicated, processed, stored, etc., to facilitate a designated level of data robustness in the geographically diverse data storage system. For example, without erasure coding, for p+1 geographically distributed zones, there can be manipulation of at least p+1 chunks, for example, of 128 MB each, which can be computer resource intensive where more than a small number of chunks are compromised. With zone-level erasure encoding, the p+1 chunks can be encoded into fewer coding chunks that can consume less storage space and can be communicated/accessed with less computer resources than the p+1 chunks, for example, in a 4+2 erasure coding scheme, two coding chunks can be distributed to provide data protection rather than replicating and storing greater numbers of replicate chunks. Then, in this example, the coding chunks can be used to recover data chunks rather than having to use the larger number of replicate chunks of a non-erasure coding system. Further, with a second level of erasure coding, e.g., chunk-level erasure coding, the compromised portions, e.g., compromised segments, etc., of an encoded chunk can be used to recover data, rather than using the entire encoded chunk of a single level erasure coding system, e.g., zone-level erasure coding.

In an embodiment, if a geographically distributed data storage system is designated as being able to tolerate a loss of any m zones/clusters/chunks, Then a first level of erasure coding, for example, a zone-level erasure coding scheme, can cause replication of chunks of each to at least m remote zones. As a result, there can be m 'backup copies' of each chunk in other zones. One of these backup copies can be selected as a 'primary' backup copy, which can be employed in encoding according to the erasure coding scheme. Encoding can be performed by a given zone, e.g., a first zone, for the primary backup chunks of other zones that have been replicated into the first zone. The first zone can, for example, encode k primary chunks, e.g., data chunks, replicated to the first zone from k different zones of the geographically diverse data storage system. In an embodiment, the first zone can encode the k replicated primary chunks because the size of a chunk is fixed, for example at 128 MB in ECS, and data padding or other data complements can be added as needed. Encoding can result in m data portions, e.g., coding chunks, that can each be the same size as a data chunk, e.g., the coding chunks can be the same size as data chunks. In some embodiments, after encoding is complete, the first zone can store one coding chunk locally and move other m−1 coding chunks to remote zones, e.g., making sure the k+m data and coding chunks are stored at different zones, whereupon the primary backup chunks used for encoding, and their peer backup chunks at other zones, can be deleted to save storage space, e.g., storing coding chunks can consume less storage space that storing primary backup and peer backup chunks representing the same data. In an embodiment, per chunk capacity overheads for geographically diverse data storage systems employing a single level of erasure coding can be approximated by: Overhead=m/k*'chunk_size'. As an example, for a 10+2 scheme, the overhead is $\frac{1}{5}^{th}$ of a 'chunk size', and for a 128 MB chunk, the overhead can be (0.2)(128 MB)=25.6 MB.

Recovery of less accessible data under a single erasure coding scheme, e.g., zone-level erasure code scheme, can be resilient against loss of 1 to m chunks. Recovery of the inaccessible chunks can be, for example, as follows. For each unavailable chunk, k peer data chunks and corresponding coding chunks can be used to perform decoding. The resulting data portion(s) can then be stored as replacements for the less accessible chunk(s). It will be noted that this illustrates the recovery of entire less accessible chunks based on entire coding chunks and entire data chunks. It will further be noted that where the number of zones in a geographically diverse data storage system is greater or equal to k+m, and where all the data and coding chunks are effectively distributed among the zones, the distributed storage can be resilient to loss of up to m zones, clusters, or chunks because erasure encoding provides a mechanism to recover compromised chunks.

A second level of erasure encoding can be applied to chunks resulting from a first level of erasure encoding. It is noted that rather than recovering an entire chunk as previously illustrated, data represented in a chunk in a geographically diverse storage system can be accessible without needing to recover the entire chunk content, e.g., recovering a missing data segment, corrupt data segment, etc., of a chunk can be sufficient to enable access to the data represented in the chunk. Recovery of a smaller amount of data can result in higher efficiency, shorter duration of the recovery operations, less burdening of computing resources, etc. As an example, where a chunk that is stored according to a zone-level erasure coding scheme is stored on a hard drive in a data center and a portion of the hard drive is corrupted, the corruption of the hard drive may only affect a small portion of the stored chunk, for example, in a 10+2 second level erasure encoding with 12 segments, loss of $\frac{3}{12}^{ths}$ of the chunk can result in the data not being accessible, etc. In this example, rather than recover the entire chunk, it can be sufficient to recover the $\frac{1}{12}^{th}$ of the chunk. Recovering the $\frac{1}{12}^{th}$ of the chunk can result in the chunk having only 2 lost segments, which according to 10+2 erasure encoding, is sufficient to still allow data access, e.g., the 10+2 coding hardens the chunk against loss of up to 2 segments without needing to undergo a recovery from a remotely stored segment from another chunk or zone. In some embodiments, all of the $3/12^{ths}$ of the chunk can be recovered so that the chunk does not comprise any inaccessible segments.

In an aspect, where a group of related chunks, hereinafter a 'peer group', all employ a same erasure coding scheme, erasure coding/decoding operations can also apply to the corresponding coding fragments. A peer group of chunks can be a group of chunks, a group of chunk fragments, etc. As an example, for chunks erasure encoded chunks A, B, C, D, E, F, etc., where A-D are data chunks and E and F are coding chunks according to a 4+2 erasure coding scheme, then the six chunks can form a protections set wherein each chunk is stored in a different geographically diverse zone. In this example, where up to two of the zones becomes less accessible, then the remaining four accessible zones can use their stored chunks to recover the less accessible chunks, for example, chunks A, B, E, and F can be used to recover chunks C and D. In another example, where each of A-F are chunk-level encoded at 12+4, then the first fragment of each of chunks A, B, E, and F can be used to recover the first fragment of chunks C and D, the 5th fragment of chunks A, B, C, and F can be used to recover the 5th fragment of chunks D and E, etc. It can be said that the chunks under the zone-level encoding form a peer group and then corresponding fragments of chunks also form a fragment peer group. Aspects of peer groups and hierarchical erasure coding can allow for recovery of chunks that was previously not possible with conventional techniques, as is disclosed herein.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate erasure coding for geographically diverse storage, in accordance with aspects of the subject disclosure. System 100 can comprise zone storage components (ZSCs), e.g., first ZSC 110, second ZSC 120, N-th ZSC 130, etc. The ZSCs can communicate with the other ZSCs of system 100, e.g., via communication framework 102, etc. A zone can correspond to a geographic location or region. As such, different zones can be associated with different geographic locations or regions, generally widely distributed to provide a distribution that can protect against all sorts of perils, e.g., political unrest, natural disaster, power grid failures, divergent costs of operation, etc. A ZSC can comprise one or more data stores in one or more locations. In an aspect, a ZSC can store at least part of a data chunk on at least part of one data storage device, e.g., hard drive, flash memory, optical disk, server storage, etc. Moreover, a ZSC can store at least part of one or more data chunks on one or more data storage devices, e.g., on one or more hard disks, across one or more hard disks, etc. As an example, a ZSC can comprise one or more data storage devices in one or more data storage centers corresponding to a zone, such as a first hard drive in a first location proximate to Miami, a second hard drive also proximate to Miami, a third hard drive proximate to Orlando, etc., where the related portions of the first, second, and third hard drives correspond to, for example, a 'Florida zone', 'Southeastern United States zone', etc. This zone can be distinct from a 'South American zone' that, for example, can comprise storage devices in Sao Paolo, Brazilia, etc.

In an aspect, data chunks, e.g., chunk 112 to chunk 116, 122 to 126, 132 to 136, etc., can be replicated in their source zone, in a geographically diverse zone, in their source zone and one or more geographically diverse zones, etc. As an example, a Seattle zone can comprise a first chunk that can be replicated in the Seattle zone to provide data redundancy in the Seattle zone, e.g., the first chunk can have one or more replicated chunks in the Seattle zone, such as on different storage devices corresponding to the Seattle zone, thereby providing intra-zone data redundancy that can protect the data of the first chunk, for example, where a storage device storing the first chunk or a replicate thereof becomes compromised, the other replicates (or the first chunk itself) can remain uncompromised within the zone. In an aspect, data replication in a zone can be on one or more storage devices, e.g., a chunk can be stored on a first data storage device, a second chunk can be stored on a second storage device, and a third chunk can be stored on a third storage device, wherein the first, second, and third storage devices correspond to the first zone, and wherein the first, second, and third storage devices can be the same storage device or different storage devices. Replication of chunks, e.g., the first chunk, into other chunks can comprise communicating data, e.g., over a network, bus, etc., e.g., communications framework 102, etc., to other data storage locations on the first, second, and third storage devices and, moreover, can consume data storage resources, e.g., drive space, etc., upon replication. Further, access, communication, etc., of chunks can consume or burden computing resources of one or more ZSCs, components of communication framework 102, etc., wherein computing resources can comprise processing of operations on one or more processors, use of one or more memories, use of one or more network resources, etc. As such, the number of replicates and/or storage schema can be based on balancing resource costs, e.g., network traffic, processing time, cost of storage space, etc., against a level of data redundancy, e.g., how much redundancy is needed to provide a level of confidence that the data/replicated data will be available.

In an aspect, system 100 can comprise one or more erasure coding control components (ECCC), e.g., ECCC 108, 118, 128, 138, etc. An ECCC can enable erasure coding of data. In an aspect, an ECCC can facilitate one or more erasure coding schemes, for example, a zone-level erasure coding scheme that erasure codes chunks between zones of a geographically diverse data storage system (GEO), a chunk-level erasure coding scheme that erasure codes chunk segment(s) of a chunk(s) in a zone of a GEO, etc., or combinations thereof, e.g., in a hierarchical manner, etc. In an embodiment, ECCC 108 can interact with the ZSCs of system 100 via communication framework 102 to orchestrate erasure coding scheme(s) for system 100. In another embodiment, ECCC 108 can orchestrate a first erasure coding scheme, e.g., a zone-level erasure coding scheme, etc., between ZSCs of system 100, while ECCCs 118, 128, 138, etc., each orchestrate a second erasure coding scheme, e.g., a chunk-level reassure coding scheme, etc., at corresponding ZSCs 110, 120, 130, etc. In an aspect, chunk-level erasure coding can generate a protection set comprising chunk segments, e.g., comprising data chunk segments and code chunk segments, the protected chunks can further be zone-level encoded, which can generate a second protection set comprising chunks, e.g., data chunks and code chunks, whereby, the data chunk segment locations in the zone-level data chunks can be known from the chunk-level encoding of the corresponding data chunks such that loss of a data chunk segment can be recovered from by recovering the data chunk segment from the corresponding zone-level protection set. In a first example embodiment, this example can comprise recovery of all lost data chunk segments. In a second example embodiment, this example can comprise recovery of just enough lost data chunk segments to enable the chunk-level protection set to recover other lost data chunk segments. This second example embodiment can consume fewer computing resources than the first example embodiment because less than all the lost data chunk segments can be recovered in the second example embodiment than the first example embodiment. Additional embodiments are readily appreciated and are to be considered within the scope of the present disclosure even where not explicitly recited for the sake of clarity and brevity.

In an aspect, an ECCC can enable encoding according to an erasure coding scheme. In a further aspect, an ECCC can enable decoding based on an erasure coding scheme. As an example, ECCC 118 can interact with other ECCCs, e.g., 128, 138, 108, etc., to enable a zone-level erasure encoding of a chunk of chunks 112 to 116 among ZSCs 110-130, etc., and can further enable a chunk-level encoding of a chunk that was subject to the zone-level erasure encoding, e.g., the chunk-level encoding can encode chunk segments for a chunk that can be an encoded chunk of a zone-level erasure encoding. Accordingly, this example hierarchical erasure encoding can illustrate that the zone-level encoding can, in an embodiment, protect against the loss of a whole chunk, a whole zone, etc., while the chunk-level encoding can, in the embodiment, protect against loss of a chunk segment of a chunk in a zone. Moreover, the example hierarchical erasure encoding can allow for system 100 to consume fewer computing resources than would otherwise be required to recover a whole chunk to replace a compromised chunk, where recovery of a chunk segment of the compromised chunk would be sufficient to enable access to data represented in the compromised chunk.

Figure 2:
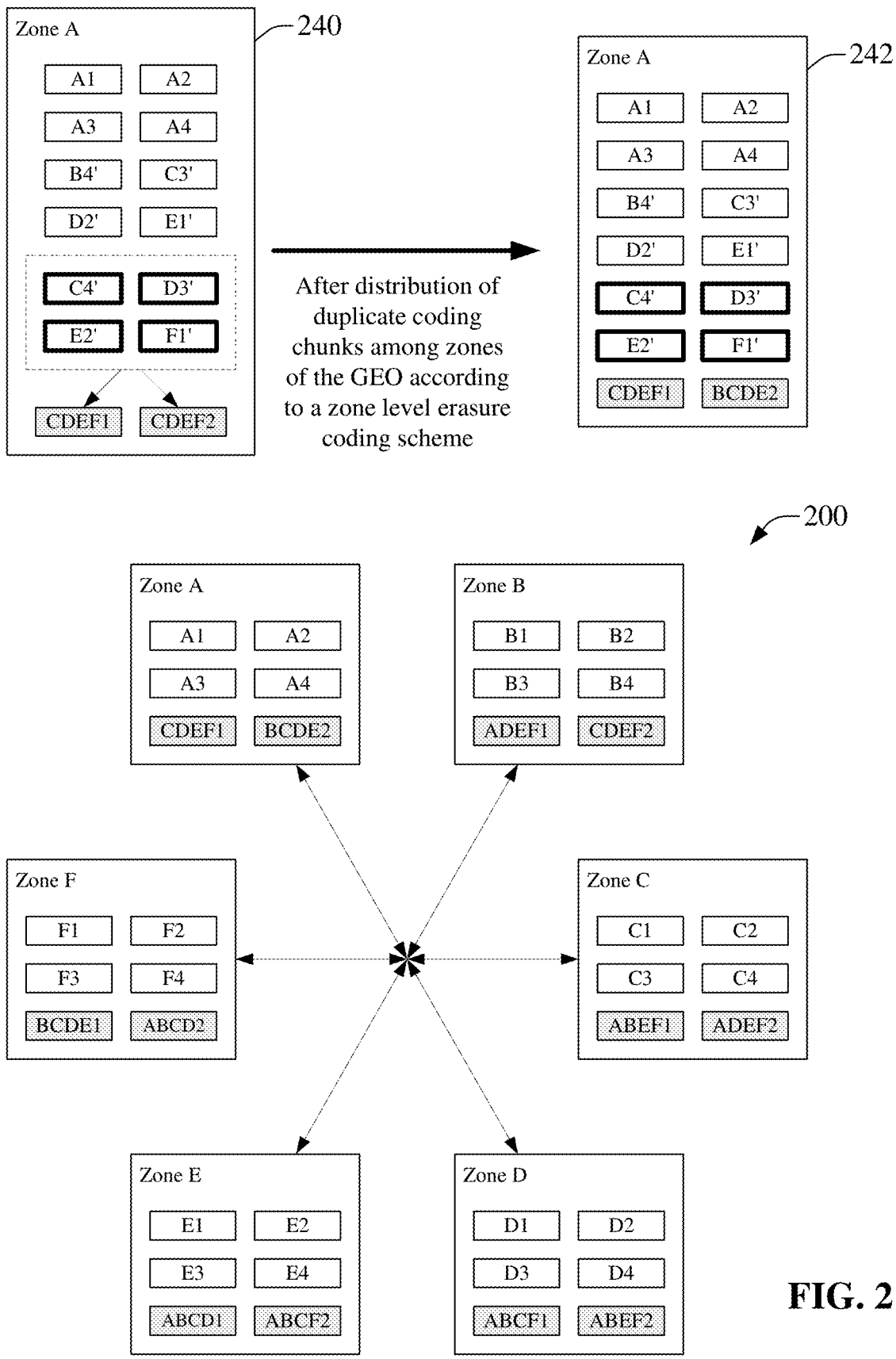
FIG. 2 is an illustration of an example system that can facilitate zone-level erasure coding of chunk-level encoded chunks for geographically diverse storage, in accordance with aspects of the subject disclosure.

FIG. 2 is an illustration of a system 200, which can enable zone-level erasure coding of chunk-level encoded chunks for geographically diverse storage, in accordance with aspects of the subject disclosure. System 200 can comprise a GEO having zones A-F, e.g., six zones. Each of the zones can store data chunks, e.g., Zone A can store chunks A1-A4, etc. Moreover, each of the zones can store other chunks, for example, replicates of chunks from other zones, e.g., Zone A at 240 can store chunks C4', D3', E2', . . . , F1', etc., which can correspondingly be replicates of C4, D3, E2, . . . , F1, etc., from other zones, e.g., Zones B-F, etc. Each zone can store code chunks, e.g., shaded chunk CDEF1, etc., of Zone A in system 200, etc. A code chunk can result from encoding of data chunks. As an example, a data chunk can be used to directly store user provided data, e.g., chunk A1, A2, A3, A4, etc., of Zone A in system 200, while a code chunk can comprise data that can be used via erasure code decoding of available data to generate other data, e.g., remaining data chunks can be decoded based on code chunks to recover lost chunks. As can be observed, Zone A can replicate its chunk A1 to Zone B and Zone C; chunk A2 to Zone C and Zone D; chunk A3 to Zone D and Zone E; and chunk A4 to Zone E and Zone F. Similar processes can be undertaken for the remainder of the zones. In an aspect, storage of a data chunk and a code chunk is generally indistinguishable, which, in some embodiments, can allow for a second layer of erasure coding to be performed on coding chunks and corresponding data chunks.

System 200 can illustrate a first encoding of replicate data according to a first erasure coding scheme, e.g., a zone-level encoding scheme, etc. Zone A can comprise data chunks A1-A4 and encoded code chunks CDEF1 and BCDE2 that can be code chunks that can be used to decode lost data chunks in other zones or other lost zones. Zone A 242 can comprise chunks, e.g., data chunks and coding chunks generated from the primary replicates C4', D3', E2', and F1', e.g., which can be primary replicates of C4, D3, E2, and F1 from Zones C, D, E, and F. Accordingly, the replicates C4', D3', E2', and F1' can be deleted after the coding chunks are generated and distributed because the coding chunks can now provide data protection.

In an aspect, system 200 can illustrate a 4+2 erasure coding scheme, e.g., 2 coding chunks are created for 4 data chunks. After creation of the two code chunks, one of the code chunks, e.g., CDEF2, can be moved to another zone to provide protection against loss of both code chunks, e.g., both CDEF1 and CDEF2 can become less accessible where they both reside in a same compromised zone, for example, where a ZSC, a zone, etc., comprising both code chunks becomes less accessible, etc. At 242 of FIG. 2, a copy of a code chunk, for example from Zone F, can be moved to Zone A, e.g., BCDE2 can be moved from Zone F into Zone A, leaving BCDE1 at Zone F. The other five zones, e.g., B-F, can similarly produce their own coding chunks from their stored primary backup chunks, e.g., non-primary backup chunks can be ignored in the creation of the illustrated code chunks in each zone. Further, each other zone can similarly move a copy of a code chunk to another zone for protection and redundancy.

After the code chunks are created and a copy is moved to another zone, the contributing primary chunks in each zone become unnecessarily redundant. Similarly, the secondary, tertiary, etc., backup chunks also can become unnecessarily redundant because the code chunks are also stored across multiple zones. As such, all backup chunks other than those of the k+m protection set can be deleted, which can result in a first zone storing its data chunks, a first code chunk for primary data chunks of a second zone, and a second code chunk for primary chunks of a third zone. The deletion of backup chunks in other zones can similarly be performed with the example illustrated results depicted in system 200. In system 200, for example, the capacity overheads associated with replication is reduced by a factor of four over simply having full copies of other chunks as backup, e.g., two coding chunks in example system 200 can use ¼th the space of eight full backup chunk copies. Further, the zone-level erasure coding illustrated, e.g., the 4+2 erasure coding, enables the GEO to recover data from failures of up to two zones, up to two chunks, etc.

Figure 3:
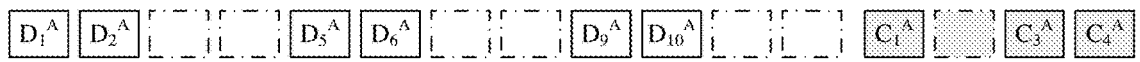
FIG. 3 illustrates an example system comprising damaged chunks that have been encoded via hierarchical erasure coding, in accordance with aspects of the subject disclosure.
Figure 3:
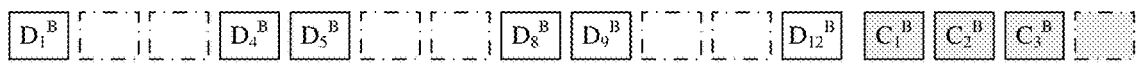
Figure 3:
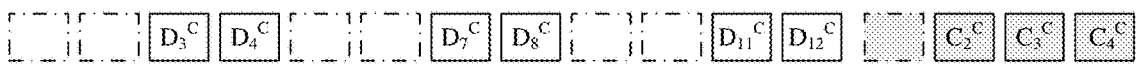
Figure 3:
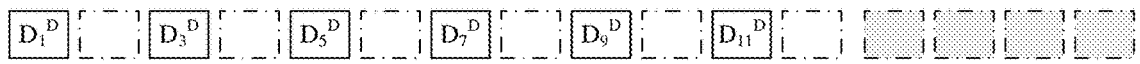
Figure 3:
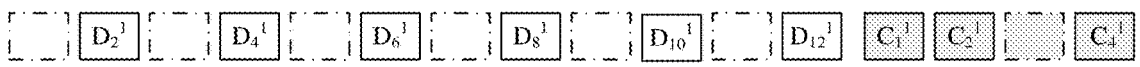
Figure 3:
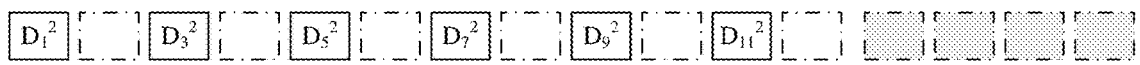

FIG. 3 is an illustration of a system 300 comprising damaged chunks that have been encoded via hierarchical erasure coding, in accordance with aspects of the subject disclosure. In an aspect, none of chunks 351-356 would generally be recoverable via conventional techniques, e.g., chunk-level recovery alone would typically not be possible where each of chunks 351-356 are missing more than four fragments, zone-level recovery alone would also typically not be possible where there are not whole chunks available to participate in a 4+2 erasure coding recovery, etc. However, system 300 can take advantage of fragment peer group recovery. In an aspect, corresponding fragments of each chunk can form a fragment peer group where the chunks comprising the fragments are part of a peer group of chunks. As an example, fragment $D_1^A$ of chunk 351, fragment $D_1^B$ of chunk 352, fragment $D_1^D$ of chunk 354, and fragment $D_1^2$ of chunk 356 can be part of a fragment peer group for first fragments of chunks 351-356. As such, the fragment peer group can facilitate recovery according to the same ensure coding scheme as is used to encode the chunk peer group for chunks 351-356, e.g., where chunks 351-356 employ a 4+2 EC scheme, then corresponding fragments thereof are also encoded according to the 4+2 EC scheme. As such, fragments $D_1^A$ of chunk 351, $D_1^B$ of chunk 352, $D_1^D$ of chunk 354, and $D_1^2$ of chunk 356 can be employed to recover corresponding missing fragments of chunk 353 and 355 according to the 4+2 EC scheme. This can be in contrast to the 4th fragments of chunks 351-356 being too few to enable 4+2 EC scheme recovery, e.g., there are only three viable 4th fragments remaining in the 4th fragments, e.g., $D_4^B$ of chunk 352, $D_4^C$ of chunk 353, and $D_4^1$ of chunk 355, and the fragment peer group can be understood to be missing three corresponding 4th fragments from the remaining peer group chunks. In this example, the 4+2 EC scheme can enable recovery where up to two of the fragment peer group fragments are less accessible. As such, where in this example there are three missing fragments, the 4+2 EC scheme cannot be used to recover the corresponding 4th fragments.

In the illustrated example system, the peer group chunks 351-356 can also allow fragment recovery, in addition to the 1st fragments, of the 5th fragments, and 9th fragments. In an aspect, fragment $D_5^A$ of chunk 351, fragment $D_5^B$ of chunk 352, fragment $D_5^D$ of chunk 354, and fragment $D_5^2$ of chunk 356 can facilitate 4+2 EC scheme decoding to recover missing 5th fragments of chunks 353 and 355. In a similar aspect, fragment $D_9^A$ of chunk 351, fragment $D_9^B$ of chunk 352, fragment $D_9^D$ of chunk 354, and fragment $D_9^2$ of chunk 356 can facilitate 4+2 EC scheme decoding to recover missing 9th fragments of chunks 353 and 355.

In the example embodiment this can result in chunks 353 and 355 each now comprising twelve viable fragments. Whereas chunk 353 is chunk-level encoded according to an example 12+4 EC scheme and chunk 355 is similarly 12+4 EC scheme chunk-level encoded, chunk 353 can undergo a 12+4 EC scheme chunk-level decoding to recover the still missing 2nd, 6th, and 10th fragment based on the 12 viable fragments of chunk 353 after the aforementioned fragment peer group zone-level recovery. Similarly, chunk 355 can undergo a 12+4 EC scheme chunk-level decoding to recover the still missing 3rd, 7th, and 11th fragment based on the 12 viable fragments of chunk 355 after the aforementioned fragment peer group zone-level recovery. This can result in each of chunks 353 and 355 having recovered all data fragments. In an aspect, the missing coding fragments can also be recovered in an embodiment. In another embodiment, the missing coding fragments can be regenerated, rather than recovered, based on the full complement of fragments now populating the chunks after recovery.

In an aspect, where chunks 353 and 355 are fully recovered, the disclosed subject matter supports performing another iteration of fragment peer group zone-level recovery. In an aspect, where there are still insufficient fully recovered peer group chunks, fragment peer group recovery can enable recovery that might not otherwise be available. In a further aspect, even where there can be sufficient fully recovered peer group chunks to perform a zone-level recovery with whole chunks, which is not the situation illustrated in system 300, it can still be preferable to perform fragment peer group zone-level recovery to conserve computing resources, e.g., it can consume less network bandwidth to operate at the fragment level of the peer group than at the full chunk level of the peer group when performing zone-level EC scheme decoding, it can consume less processor time to operate at the fragment level of the peer group than at the full chunk level of the peer group when performing zone-level EC scheme decoding, it can consume less memory to operate at the fragment level of the peer group than at the full chunk level of the peer group when performing zone-level EC scheme decoding, etc. In an aspect, the iterations of the disclosed multistep recovery can proceed until the recovery completes or there are no viable decoding operations that can be performed. However, even where the full recovery may not complete, the recovery of fragments as disclosed in regard to system 300 can enable access to parts of chunks that could otherwise have been deemed lost.

Figure 4:
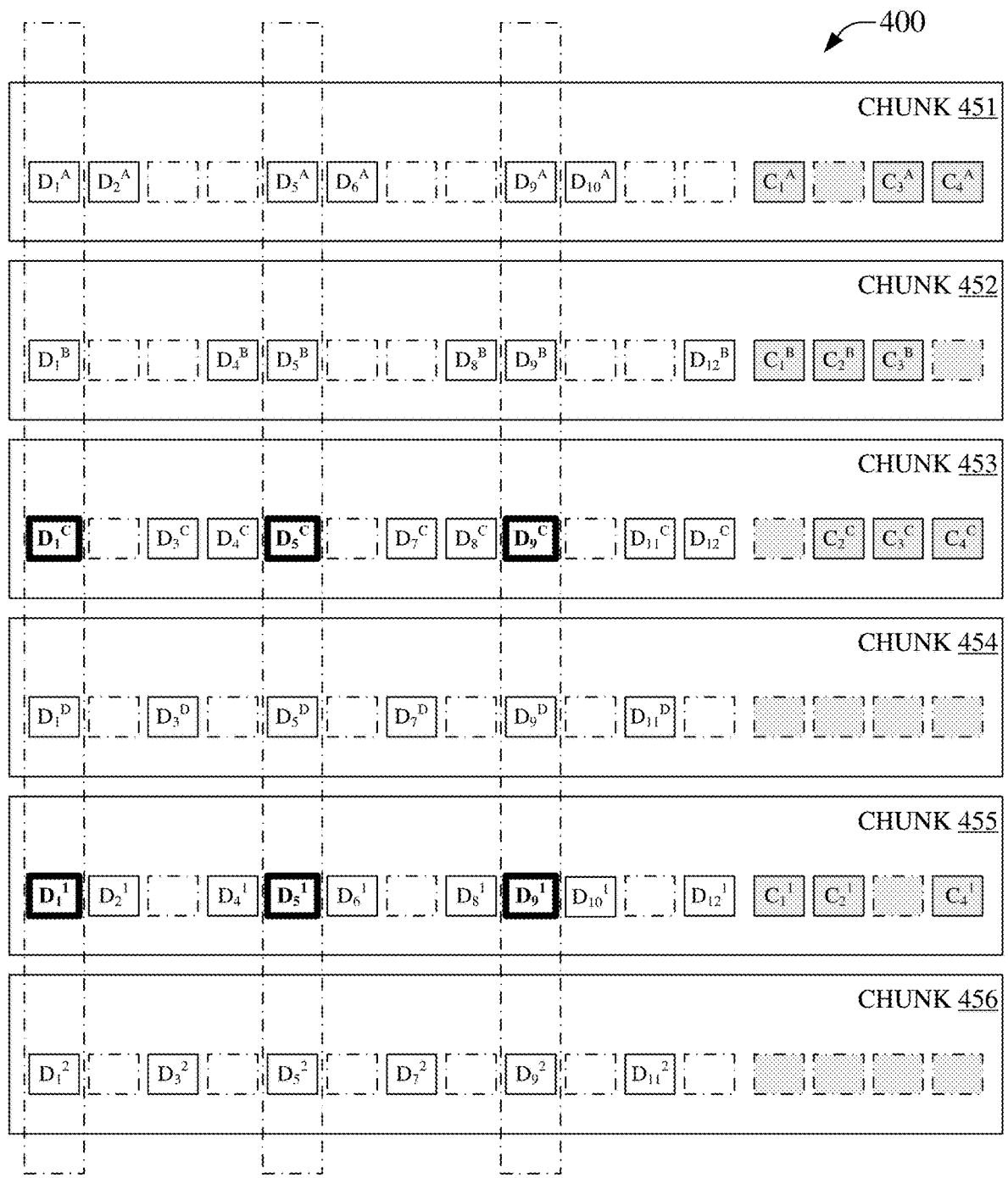
FIG. 4 is an illustration of an example system showing partial recovery of compromised data of damaged chunks via zone-level erasure decoding of peer group fragments, in accordance with aspects of the subject disclosure.

FIG. 4 is an illustration of a system 400, showing comp partial recovery of compromised data of damaged chunks via zone-level erasure decoding of peer group fragments, in accordance with aspects of the subject disclosure. System 400 can be the same as, or similar to system 300, e.g., system 400 can begin with the same example fragments as system 300 whereby system 400 can illustrate a partial recovery of fragments via fragment peer group zone-level recovery. In an aspect, system 400 can therefore comprise chunks 451-456. In an aspect, none of chunks 451-456 prior to the illustrated partial recovery would generally be considered recoverable via conventional techniques. In an aspect, corresponding fragments of each chunk can form a fragment peer group, see dash-dot rectangles encompassing fragments from each of the several chunks 451-456, where the chunks comprising the fragments are part of a peer group of chunks. As an example, fragment $D_1^A$ of chunk 451, fragment $D_1^B$ of chunk 452, fragment $D_1^D$ of chunk 454, and fragment $D_1^2$ of chunk 456 can be part of a fragment peer group for first fragments of chunks 451-456. As such, the fragment peer group can facilitate recovery according to the same ensure coding scheme as is used to encode the chunk peer group for chunks 451-456, e.g., where chunks 451-456 employ a 4+2 EC scheme, then corresponding fragments thereof are also encoded according to the 4+2 EC scheme. As such, fragments $D_1^A$ of chunk 451, $D_1^B$ of chunk 452, $D_1^D$ of chunk 454, and $D_1^2$ of chunk 456 can be employed to recover corresponding missing fragments of chunk 453 and 455 according to the 4+2 EC scheme. In the illustrated example system 400, the peer group chunks 451-456 can allow further fragment recovery of the 5th fragments, and 9th fragments. In an aspect, fragment $D_5^A$ of chunk 451, fragment $D_5^B$ of chunk 452, fragment $D_5^D$ of chunk 454, and fragment $D_5^2$ of chunk 456 can facilitate 4+2 EC scheme decoding to recover 5th fragments of chunks 453 and 455. In a similar aspect, fragment $D_9^A$ of chunk 451, fragment $D_9^B$ of chunk 452, fragment $D_9^D$ of chunk 454, and fragment $D_9^2$ of chunk 456 can facilitate 4+2 EC scheme decoding to recover missing 9th fragments of chunks 453 and 455. The recovered fragments of the 1st, 5th, and 9th fragment peer groups are illustrated in bold to facilitate comprehension.

As is noted with regard to system 300, in system 400, some fragment peer groups comprise insufficient fragments to enable recovery via fragment peer group zone-level decoding, for example, the 2nd, 6th, and 10th fragment peer groups each have only two viable fragments, and the 3rd, 4th, 7th, 8th, 11th, and 12th fragment peer groups each have only three viable fragments, which is an insufficient number of fragments to perform the fragment peer group zone-level recovery within the noted fragment peer groups.

Figure 5:
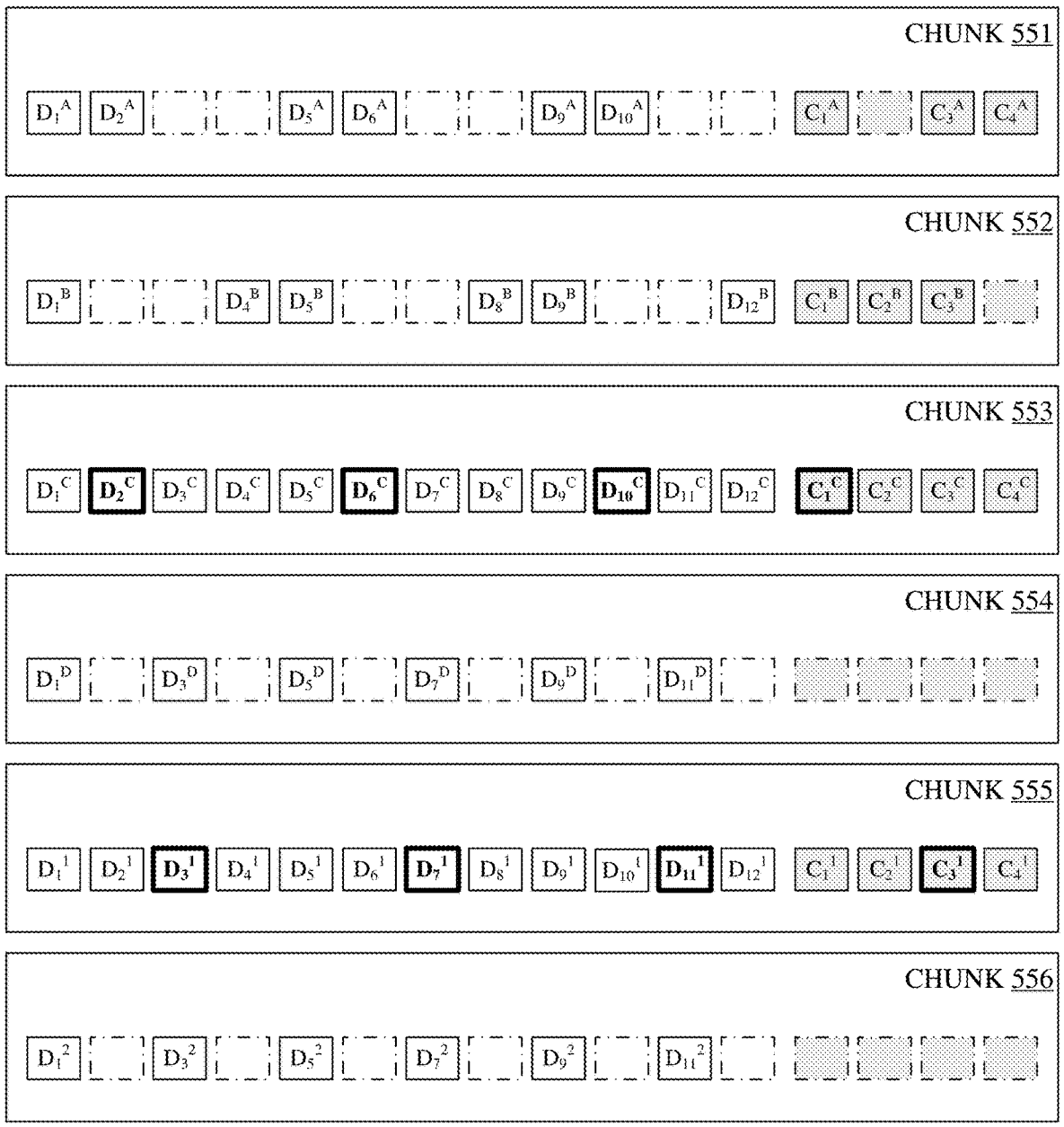
FIG. 5 is an illustration of an example system showing further partial recovery of compromised data of damaged chunks via chunk-level erasure decoding, in accordance with aspects of the subject disclosure.

FIG. 5 is an illustration of an example system 500 showing further partial recovery of compromised data of damaged chunks via chunk-level erasure decoding, in accordance with aspects of the subject disclosure. System 500 can be the same as, or similar to system 300, e.g., system 500 can begin with the same example fragments as system 300, proceed via partial recovery as illustrated in system 400, which can enable system 500 to further partially recover of fragments via chunk-level recovery. In an aspect, system 500 can therefore comprise chunks 551-556. In an aspect, none of chunks 551-556 prior to the illustrated partial recovery in system 400 and 500 would generally be considered recoverable via conventional techniques. In an aspect, where fragments $D_1^C D_5^C$, and $D_9^C$ of chunk 553 can have been previously recovered, for example, as illustrated in system 400, and similarly, $D_1^1 D_5^1$, and $D_9^1$ of chunk 555 can have been previously recovered, each of chunks 553 and 555 can comprise twelve viable fragments. As an example, chunk 553 can comprise the 1st, 3rd-5th, 7th-9th, and 11th-12th data fragments and the 2nd-4th coding fragments, for a total of 12 of the 16 fragments of chunk 553, corresponding to the example 12+2 EC scheme use dot encode chunk 553. Similarly, chunk 555 can comprise the 1st-2nd, 4th-6th, 8th-10th, and 12th data fragments and the 1st-2nd and 4th coding fragments, for a total of 12 of the 16 fragments of chunk 555.

In an aspect, the example 12+4 chunk-level EC scheme encoding each of chunk 553 and 555 can enable chunk-level recovery where up to four of the 16 fragments is less available, missing, damaged, etc. As such, each of chunks 553 and 555 can be chunk-level recovered based on there being 12 viable fragments in each. Accordingly, for example, chunk 553 can recover fragments $D_2^C$, $D_6^C$, and $D_{10}^C$, based on the other 12 viable fragments of chunk 553. As a further example, chunk 555 can recover fragments $D_3^1$, $D_7^1$, and $D_{11}^1$, based on the other 12 viable fragments of chunk 555. This can result in each of chunks 553 and 555 having recovered all data fragments. In an embodiment, the missing coding fragments can also be recovered in a similar manner or, in another embodiment, the missing coding fragments can be regenerated, rather than recovered, based on the full complement of data fragments now populating the chunks after chunk-level recovery of the data fragments of chunks 553 and/or 555.

Figure 6:
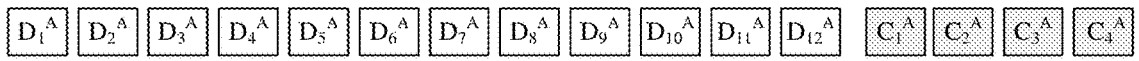
FIG. 6 illustrates an example system showing full recovery of compromised data via iterative partial recoveries via zone-level and chunk-level erasure coding recovery, in accordance with aspects of the subject disclosure.
Figure 6:
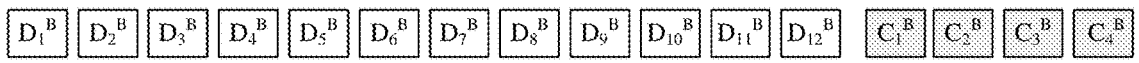
Figure 6:
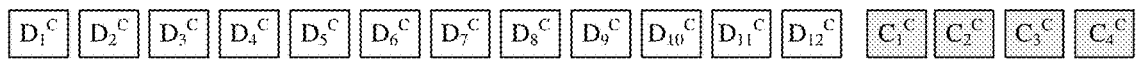
Figure 6:
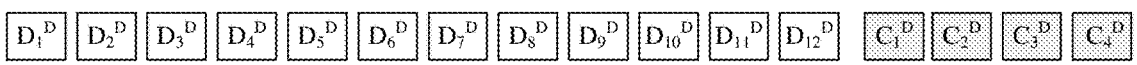
Figure 6:
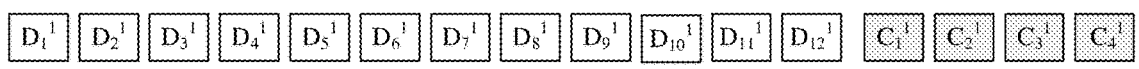
Figure 6:
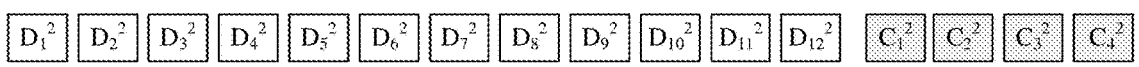

FIG. 6 is an illustration of example system 600 showing full recovery of compromised data via iterative partial recoveries via zone-level and chunk-level erasure coding recovery, in accordance with aspects of the subject disclosure. System 600 can be the same as, or similar to system 300, e.g., system 600 can begin with the same example fragments as system 300, proceed via partial recovery as illustrated in system 400, enjoy further partial recovery as illustrated in system 500, and undergoing further iterations of fragment peer group zone-level recovery and chunk-level recovery that can enable system 600 to enjoy full recovery of fragments, as illustrated. In an aspect, system 600 can therefore comprise chunks 651-656. In an aspect, none of chunks 651-656 prior to the illustrated fragment peer group zone-level and chunk-level recoveries illustrated in systems 400 and 500 would generally be considered recoverable via conventional techniques. In an aspect, where fragments $D_1^C$ $D_5^C$, and $D_9^C$ of chunk 653 can have been previously recovered, for example, as illustrated in system 400, and where fragments $D_2^C$, $D_6^C$, and $D_{10}^C$, can have been previously recovered, for example, as illustrated in system 500, further iterations of the partial recovery can be enabled for other chunks of the peer group, e.g., chunks 651-656. Similarly, chunk 655 can have previously recovered fragments $D_1^1 D_5^1$, and $D_9^1$, as illustrated in system 400 and fragments $D_3^1$, $D_7^1$, and $D_{11}^1$, as illustrated in system 500.

The further partial recovery iterations can therefore employ the fully populated chunks 653 and 655. As an example, the 3rd, 7th, and 11th fragments of the peer group can be employed to recovery the corresponding missing fragments of chunk 651 and 652 according to fragment peer group zone-level EC decoding, e.g., in a manner similar to that illustrated for the peer groups of system 400, etc. Upon recovery of these missing fragments, another iteration of chunk-level recovery at each of chunks 651 and 652 can be enabled based on each of these chunks now comprising 12 viable fragments, e.g., in a manner similar to that illustrated for system 500, etc. This can result in full recovery of chunks 651, and 652.

Still further partial recovery iterations can be undertaken, now employing fully recovered chunks 651, 652, 653, and 655. Similar to that previously illustrated in system 400, fragment peer group zone-level recovery can be performed, for example, on the 2nd, 4th, 6th, 8th, 10th, and 12th fragment peer groups, followed by chunk-level recovery of 654 and 656, similar to that previously illustrated for system 500. This can result in recovery of all fragments of the peer group comprising chunks 651-656 that, under conventional techniques, would have been treated as lost data. In an aspect, it can be desirable to perform fragment recovery at the zone-level to conserve computing resources, however, it is feasible that recovery of sufficient numbers of peer group chunks can enable recovery via zone-level recovery of full chunks. As an example, where system 600 comprises recovered chunks 651, 652, 653, and 655, these four full chunks can employ zone-level decoding according to the example 4+2 EC scheme to recover chunk 644 and/or chunk 656 without further reliance on fragment peer group zone-level recovery and/or chunk-level recovery iterations.

In an aspect, damage to some chunks, though not illustrated, can facilitate starting multistep recovery by performing a chunk-level recovery prior to a fragment peer group zone-level recovery, for example, where a chunk of the peer group comprises at least k fragments, then the chunk can first recover via chunk-level EC scheme decoding before advancing to an iteration of fragment peer group zone-level recovery. In an aspect, iterations of fragment peer group zone-level recovery and/or chunk-level recovery in the disclosed multistep recovery techniques can proceed until a full recovery is achieved, or, where full recovery is not possible, until there are no other viable decoding operations that can be performed so as to recover as much data as is possible, thereby minimizing actual data loss where full recovery is still not feasible even under the presently disclosed advanced recovery technology.

Figure 7:
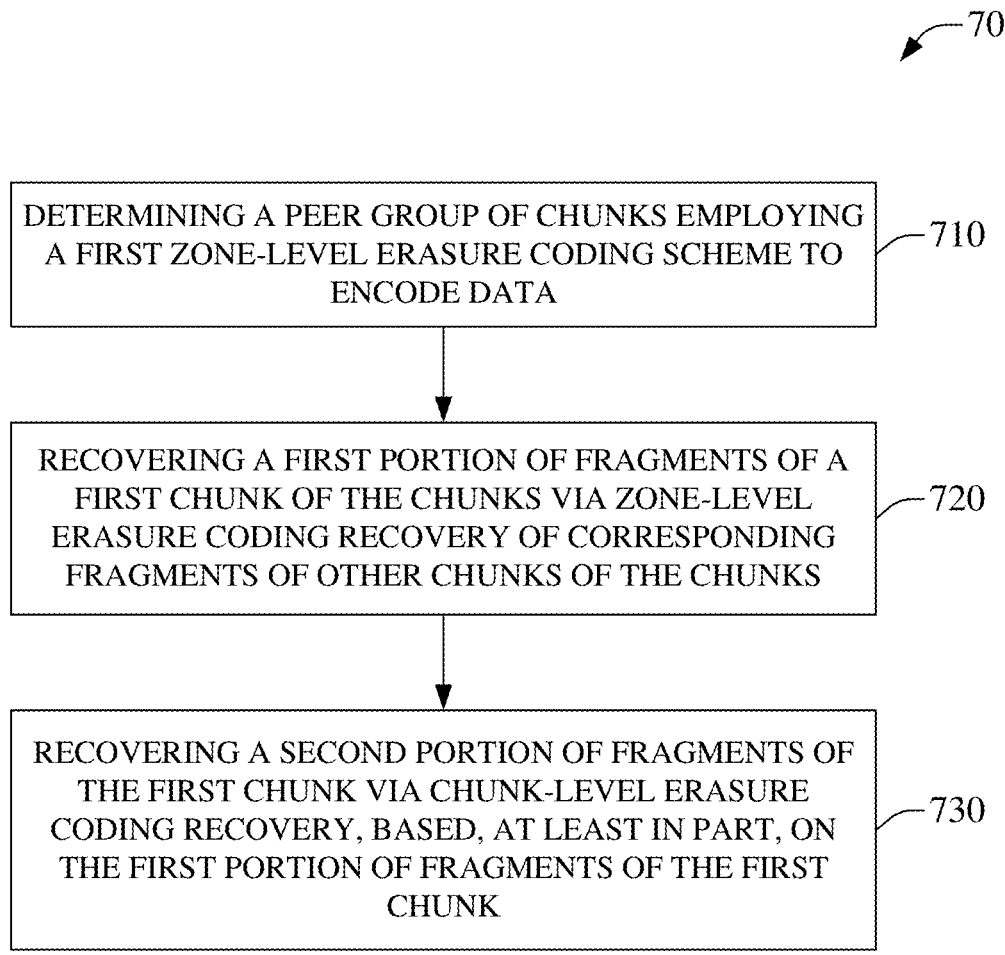
FIG. 7 is an illustration of an example method facilitating partial recovery of data via multistep zone-level and chunk-level erasure coding recovery, in accordance with aspects of the subject disclosure.
Figure 8:
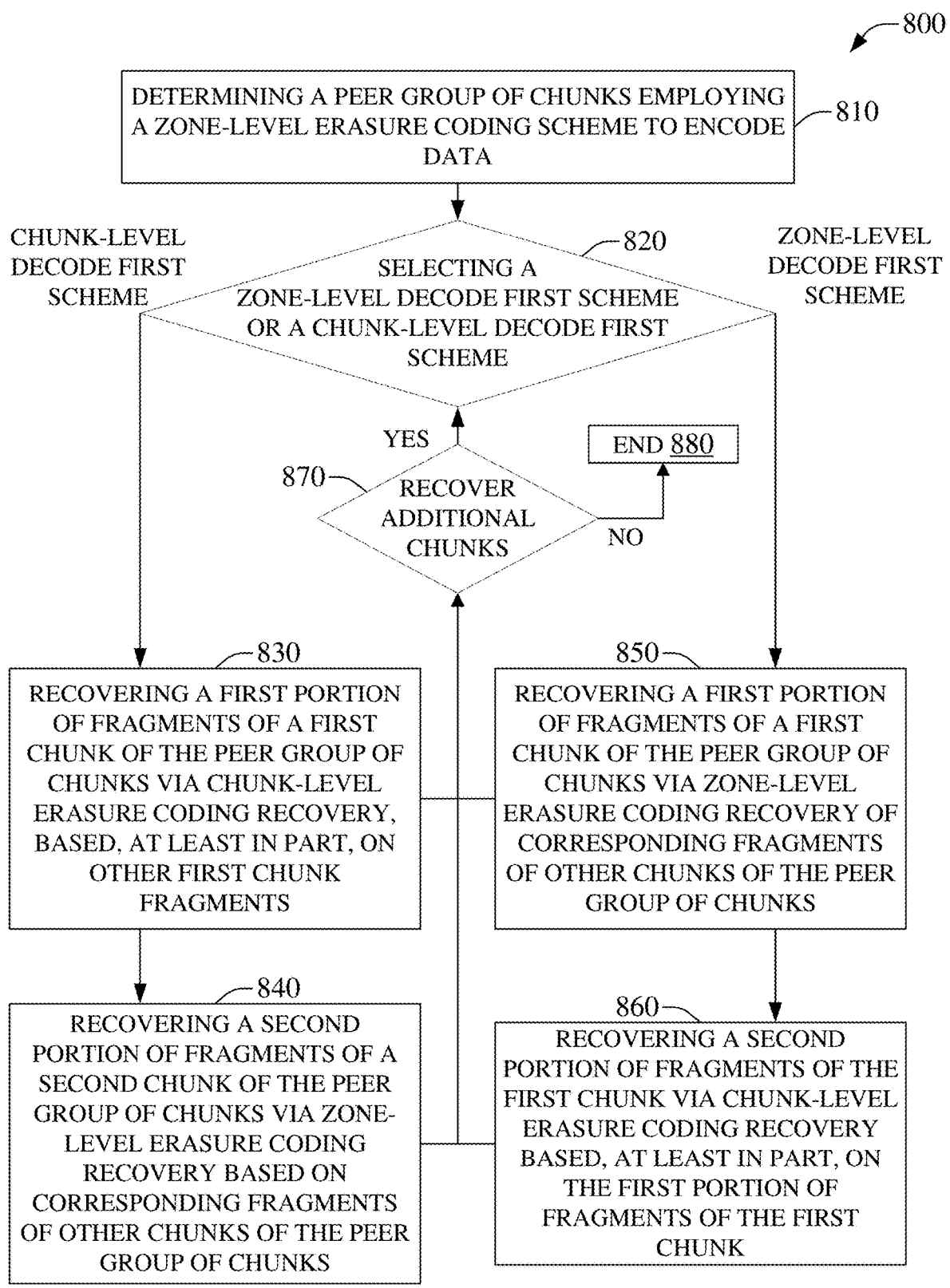
FIG. 8 illustrates an example method facilitating at least partial recovery of data via multistep zone-level and chunk-level erasure coding recovery, wherein the multistep zone-level and chunk-level erasure coding recovery can begin at the zone-level or at the chunk-level, in accordance with aspects of the subject disclosure.

In view of the example system(s) described above, example method(s) that can be implemented in accordance with the disclosed subject matter can be better appreciated with reference to flowcharts in FIG. 7-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described.

It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 7 is an illustration of an example method 700, which can facilitate partial recovery of data via multistep zone-level and chunk-level erasure coding recovery, in accordance with aspects of the subject disclosure. At 710, method 700 can comprise determining a peer group of chunks employing a zone-level erasure coding scheme to encode whole data chunks and whole code chunks. The zone-level erasure coding scheme facilitates fragment peer groups, such that corresponding fragments of the zone-level encoded peer chunks can be employed to recover other corresponding fragments of other zone-level encoded peer chunks. Moreover, each zone-level encoded peer chunk can also be hierarchically erasure coded at a chunk-level such that the fragments within a chunk can be employed to recover other fragments within the same chunk. As an example, under a 4+2 zone-level EC scheme, chunks A, B, C, D, E, F, etc., can form a peer group of chunks where A, B, C, and D can be data chunks and E and F can be coding chunks. Moreover, in this example, each of chunks A-F, etc., can be chunk-level encoded according to a chunk-level EC scheme, for example a 12+4 EC scheme that can generate 12 data fragments and four coding fragments for each of chunks A-F, etc. Continuing this example, 1st fragments of A, B, D, and F can be used to decode a corresponding 1st fragment of C and/or E; 9th fragments of B, C, D, and E can be used to decode a corresponding 9th fragment of A and/or F; etc.

At 720, method 700 can comprise recovering a first portion of fragments of a first chunk of the chunks. In an aspect, the recovering can be via a zone-level decoding of available corresponding fragments of the chunks where sufficient fragments are available. As an example, for a 4+2 zone-level EC scheme where k=4 and m=2, the zone-level decoding can be successful where at least k, e.g., 4, corresponding fragments are available because the zone-level EC scheme can recover data up to a loss of m chunks or corresponding fragments thereof. Accordingly, for example, where a first chunk has a damaged first fragment, the first chunk of a second chunk, third chunk, fourth chunk, and first coding chunk can be employed, according to an example 4+2 EC scheme, to recover the damaged first fragment data. In an aspect, the fragments can be generated according to a chunk-level EC scheme that can be the same as, or different than, the zone-level EC scheme, as an example, the chunk-level EC scheme can be 4+2, 10+2, 12+4, etc., and the zone-level EC scheme can be 4+2, 10+2, 10+4, 12+4, etc. Generally, all chunks of the peer group can employ the same erasure coding scheme and, accordingly, fragments can correlate to corresponding fragments among the chunks of the peer group. As an example, a first fragment of a first chunk can correspond to a first fragment of a second chunk, wherein the first and second chunk are part of the peer group, and wherein the first and second chunk employ the same erasure coding scheme. The recovering can be via deconvolution of corresponding fragments of other chunks of the chunks.

Method 700, at 730, can comprise recovering a second portion of fragments of the first chunk via chunk-level erasure coding recovery, based, at least in part, on the first portion of fragments of the first chunk. At this point method 700 can end. In an aspect, the first chunk can undergo chunk-level EC decoding where there are sufficient fragments in the first chunk. In an embodiment, the first chunk can already comprise sufficient fragments to undergo a chunk-level decoding recovery, e.g., where the chunk-level EC scheme is 10+2, then if the first chunk has lost up to two fragments, the first chunk can undergo chunk-level recovery via decoding without needing to first recover fragments via the aforementioned zone-level fragment recovery. However, where the first chunk has lost more than the example two fragments, the zone-level EC fragment recovery can have recovered sufficient fragments from peer chunks that the first chunk has at least 10 viable fragments to support the chunk-level recovery. In an aspect, where the zone-level fragment recovery does not result in the first chunk having at least the example 10 viable fragments, the chunk-level recovery can fail for having insufficient fragments to enable decoding according to the example 10+2 EC scheme.

In an embodiment, where all chunk s of the peer group are not fully recovered, method 700 can be run again to recover more fragments via zone-level fragment recovery and subsequently recover more chunks via chunk-level recovery. Where further fragment or chunk recovery is not possible due to insufficient fragments, method 700 can end.

In an aspect, use of method 700 in an iterative manner can enable recovery of damaged chunks that would have been generally considered unrecoverable under previous conventional techniques. In an embodiment, where all data fragments of a chunk of the peer group chunks have been recovered, the chunk can also be re-encoded according to the erasure coding scheme to recover the corresponding coding fragments rather than decoding any missing coding fragments. However, in other embodiments, any missing coding fragments can be recovered via decoding at the zone-level and chunk-level.

FIG. 8 is an illustration of an example method 800, which can enable at least partial recovery of data via multistep zone-level and chunk-level erasure coding recovery, wherein the multistep zone-level and chunk-level erasure coding recovery can begin at the zone-level or at the chunk-level, in accordance with aspects of the subject disclosure. At 810, method 800 can comprise determining a peer group of chunks employing a zone-level erasure coding scheme and a chunk-level erasure coding scheme as disclosed elsewhere herein. This can be the same as, or similar to, the determining at 710 of method 700. As such, at 820, method 800 can comprise determining if a 'chunk-level decode first' scheme or a 'zone-level decode first' scheme will be employed. As an example, where a chunk(s) of the peer group comprises k or more fragments, the entire chunk can be recovered by employing a chunk-level decode first scheme. This can result in more available fragments for a subsequent fragment recovery and/or chunk recovery iteration. As another example, where no chunk of the peer group comprises at least k fragments according to a chunk-level EC scheme, then chunk-level decoding can be ineffective to recover any other fragments and fragment recovery via zone-level decoding of corresponding fragments can be preferable at 820. Where zone-level fragment recovery is not tenable due to insufficient numbers of corresponding fragments according to the zone-level EC scheme, then method 800 can end, not illustrated for clarity and brevity.

Where the chunk-level decode first scheme is indicated at 820, method 800, at 830, can comprise recovering a first portion of fragments of a first chunk of the chunks via chunk-level erasure coding recovery. The chunk-level erasure code recovery can be based, at least in part, on other fragments of the first chunk. In an aspect, where the first chunk can be damaged but can retain at least k healthy fragments, these fragments can be employed to recover other fragments of the first chunk by decoding according to the chunk-level erasure coding of the first chunk. As an example, where a first chunk encoded according to a 10+2 EC scheme comprises 11 fragments, then the first chunk can be sufficient to allow recovery of the other one missing, damaged, less-accessible, etc., fragment(s) of the first chunk via decoding according to the 10+2 erasure coding scheme.

At 840, method 800 can comprise recovering a second portion of fragments of a second chunk of the peer chunks. In an aspect, where all chunks of the peer group can employ the same erasure coding scheme and, accordingly, fragments can correlate to corresponding fragments among the chunks of the peer group, a fragment(s) of the first chunk and corresponding fragment(s) of other chunks of the peer group of chunks can be employed to recover fragments according to the zone-level EC scheme. As an example, the fragments of the first chunk can be recovered according to method 800 at 830, whereby an i-th fragment of the second chunk can be recovered by decoding an i-th fragment of the first chunk with i-th fragment(s) of other peer group chunk(s). Method 800 can then go to decision block 870.

Returning to 820, method 800 can advance to 850 where a zone-level decode first scheme is indicated. At 850, method 800 can comprise recovering a first portion of fragments of a first chunk of the chunks, via fragment recovery via zone-level decoding of corresponding fragments of other chunks of the chunks, whereby an i-th fragment of the first chunk can be recovered by decoding i-th fragment(s) of other peer group chunk(s). Method 800 can then proceed to 860, which can comprise recovering a second portion of fragments of the first chunk via chunk-level erasure coding recovery, based, at least in part, on the first portion of fragments of the first chunk. At this point method 800 can advance to decision block 870.

At 870, method 800 can determine if there are additional chunks to recover, e.g., if some chunks of the peer group remain damaged after an iteration of method 800, e.g., from 820 to 870, then an additional iteration can be performed. This can continue until there are no additional recoveries to perform, whereby method 800 can end at 880. In an aspect, no additional recoveries can be indicated where all chunks are recovered by method 800, all chunks are recovered by another method, recovery of the chunks is determined to be below a threshold value/priority/etc., the previous iteration of method 800 failed to recover further fragments/chunks, or some other cause of determining that further recovery is unwarranted.

Figure 9:
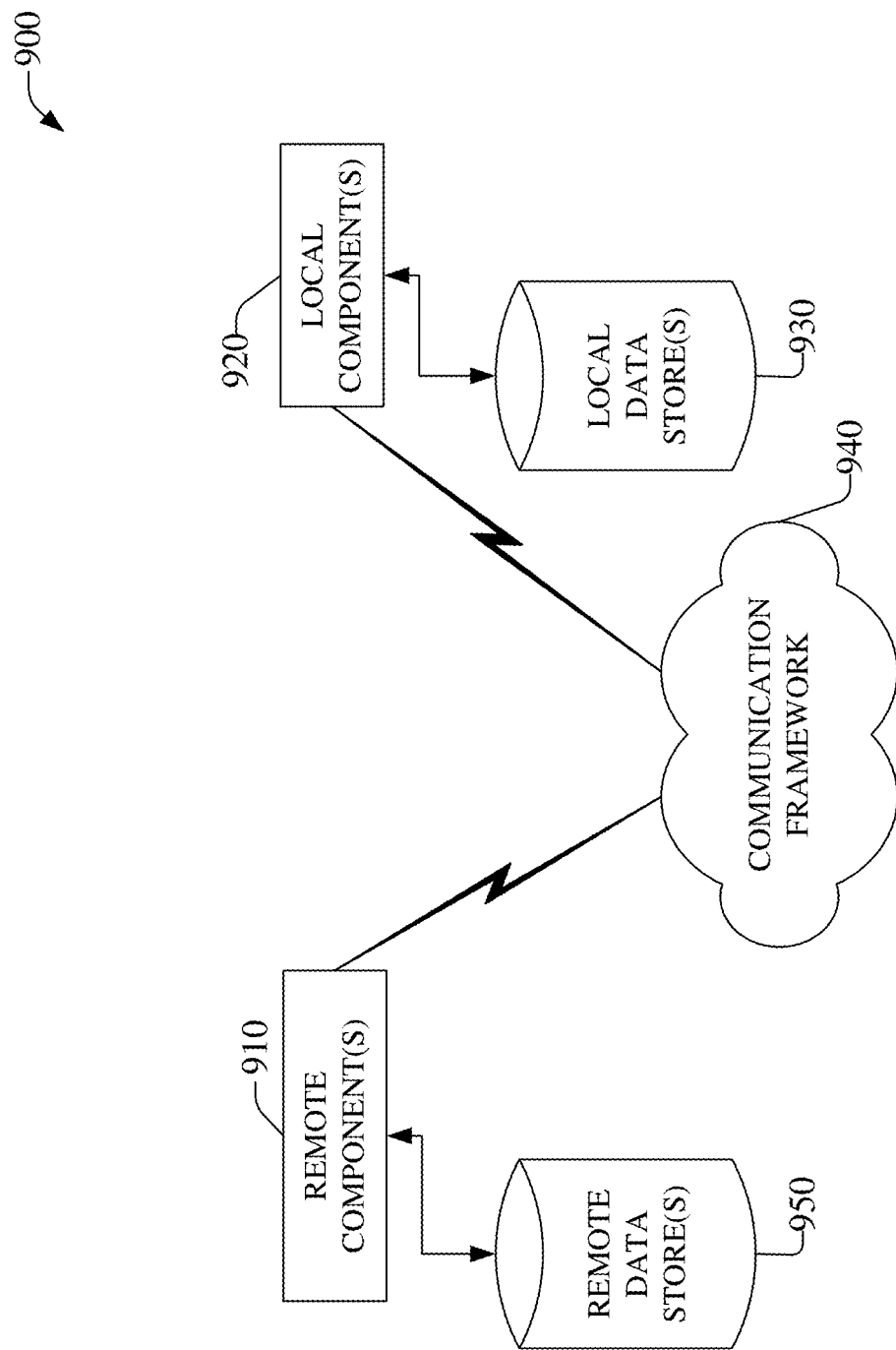
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC connected to a local ZSC via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 940. In an aspect the remotely located ZSC or local ZSC can be embodied in one or more of ZSC 110-130, 240-242, Zone(s) A-F, ECCC 108, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, information corresponding to chunks stored on ZSCs can be communicated via communication framework 940 to other ZSCs of a storage network, e.g., to facilitate protection via hierarchical erasure coding and multistep recovery, as disclosed herein.

Figure 10:
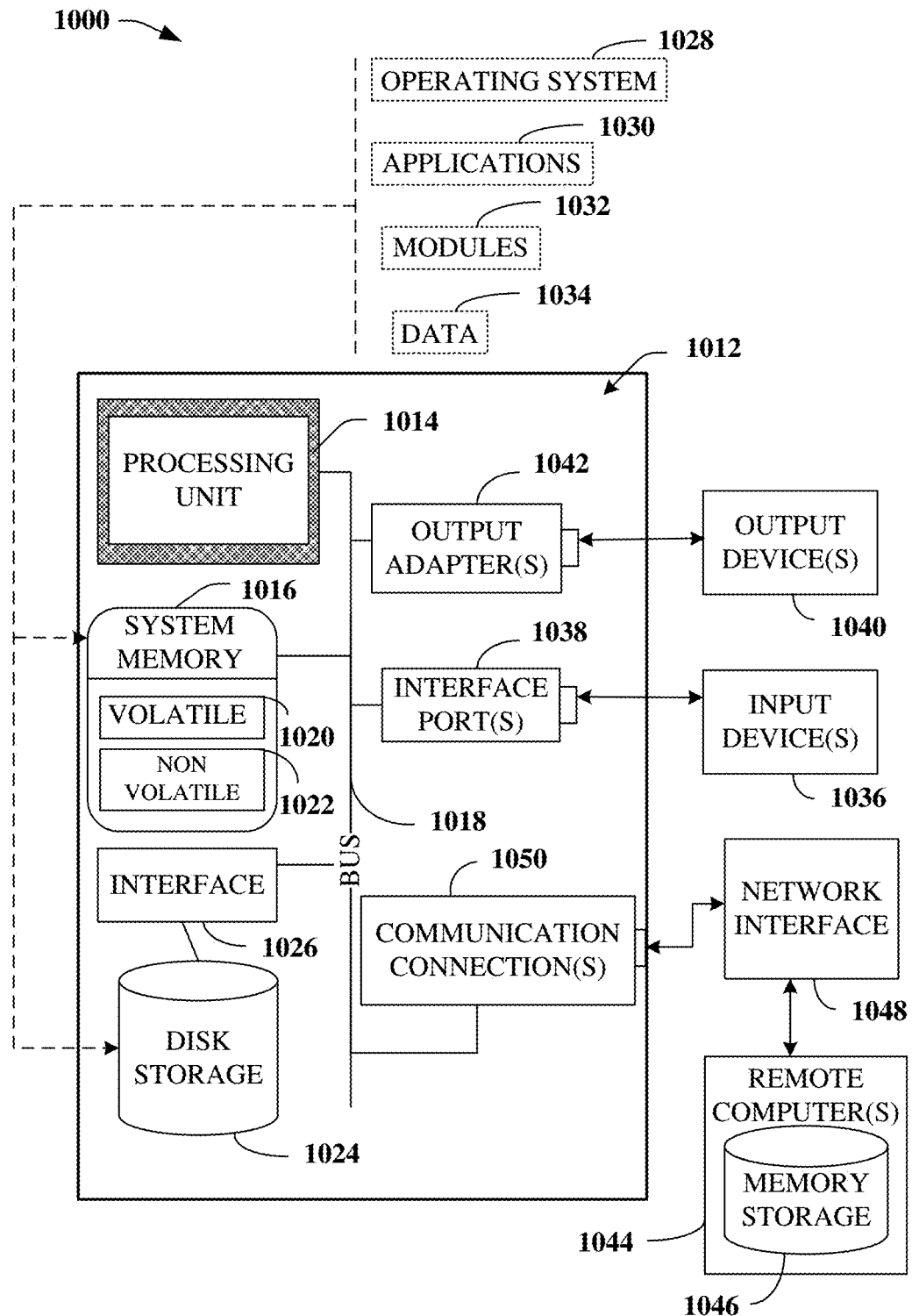
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in a ZSC 110-130, 240-242, Zone(s) A-F, etc., can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to iteratively perform operations comprising, determining a type of an iteration of a recovery process, wherein all chunks comprising a peer group of chunks employ a same chunk-level erasure coding scheme, and wherein the peer group of chunks employs a zone-level erasure coding scheme. Where the type is a 'zone-level decoding first' type, the operations can comprise performing a first zone-level decoding operation to enable recovery of a first fragment of a first chunk of the peer group of chunks based in part on a corresponding second fragment of a second chunk of the peer group of chunks, and performing a chunk-level decoding operation to enable recovery of a third fragment of the first chunk based in part on a fourth fragment of the first chunk. Subsequent iterations can be performed where additional fragments are to be recovered. Performing subsequent operations can cease where zone-level decoding can fail due to an availability of less than $k_{zone}$ corresponding fragments among chunks of the peer group of chunks, wherein the peer group of chunks can comprise $k_{zone}+m_{zone}$ chunks. Similarly, performing subsequent operations can cease where chunk-level decoding can fail due to an availability of less than $k_{chunk}$ fragments among a chunk of the peer group of chunks, wherein the chunk of the peer group of chunks can comprise $k_{chunk}+m_{chunk}$ fragments.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial busport can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
determining, in a first iteration, a peer group of chunks stored via a geographically distributed data storage system, wherein the chunks of the peer group of chunks employ a same chunk-level erasure coding scheme, and wherein the peer group of chunks employ a zone-level erasure coding scheme;
in response to selecting a 'zone-level decoding first' scheme,
recovering a first fragment of a first chunk of the peer group of chunks by employing a second fragment of a second chunk of the peer group of chunks via a first zone-level decoding operation, wherein the second fragment corresponds to the first fragment, and
recovering a third fragment of the first chunk by employing a fourth fragment of the first chunk via a first chunk-level decoding operation; and
in response to selecting a 'chunk-level decoding first' scheme,
recovering a fifth fragment of the first chunk of the peer group of chunks by employing a sixth fragment of the first chunk via a second chunk-level decoding operation, and
recovering a seventh fragment of the second chunk by employing an eighth fragment of the first chunk via a second zone-level decoding operation, wherein the eighth fragment corresponds to the seventh fragment.

2. The system of claim 1, wherein the chunk-level erasure coding scheme is a 12+4 chunk-level erasure coding scheme.

3. The system of claim 1, wherein the chunk-level erasure coding scheme is a 10+2 chunk-level erasure coding scheme.

4. The system of claim 1, wherein the zone-level erasure coding scheme is a 4+2 zone-level erasure coding scheme.

5. The system of claim 1, wherein the zone-level erasure coding scheme is a different erasure coding scheme than the chunk-level erasure coding scheme.

6. The system of claim 1, wherein the zone-level erasure coding scheme is a same erasure coding scheme as the chunk-level erasure coding scheme.

7. The system of claim 1, wherein the operations further comprise performing a second iteration comprising recovering a ninth fragment of the first chunk of the peer group of chunks by employing a tenth fragment of the second chunk of the peer group of chunks via a third zone-level decoding operation, and wherein the tenth fragment corresponds to the ninth fragment.

8. The system of claim 1, wherein the operations further comprise performing a second iteration comprising recovering an eleventh fragment of the first chunk by employing a twelfth fragment of the first chunk via a second chunk-level decoding operation.

9. The system of claim 1, wherein the operations further comprise performing subsequent iterations comprising subsequent zone-level recovery of a subsequent fragment among the chunks of the peer group of chunks and subsequent chunk-level recovery of another subsequent fragment within a chunk of the peer group chunks.

10. The system of claim 9, wherein the subsequent iterations continue until all data fragments of all chunks of the peer group of chunks are recovered.

11. The system of claim 9, wherein the subsequent iterations continue until a last iteration of the subsequent iterations fails due to a count of available fragments among chunks of the peer group of chunks being insufficient to perform a last subsequent zone-level fragment recovery operation.

12. The system of claim 9, wherein the subsequent iterations continue until a last iteration of the subsequent iterations fails due to a count of available fragments within a chunk being insufficient to perform a last subsequent chunk-level fragment recovery operation.

13. A method, comprising:
performing, by a system comprising a processor, a first iteration of operations comprising:
in response to determining that a portion of a peer group of chunks stored in a geographically diverse data storage system has become unavailable, determining a type of a first iteration of a recovery process, wherein all chunks comprising the peer group of chunks employ a same chunk-level erasure coding scheme, and wherein the peer group of chunks employs a zone-level erasure coding scheme;
in response to the type being a 'zone-level decoding first' type:
recovering, by the system via a first zone-level decoding operation, a first fragment of a first chunk of the peer group of chunks based at least in part on a second fragment of a second chunk of the peer group of chunks, wherein the second fragment corresponds to the first fragment, and
recovering, via a first chunk-level decoding operation, a third fragment of the first chunk based at least in part on a fourth fragment of the first chunk; and
in response to determining, by the system, that an indicator satisfies a condition related to continuing operations, performing a second iteration of the operations subsequent to the first iteration.

14. The method of claim 13, wherein the first iteration of operations further comprises:

in response to the type being a 'chunk-level decoding first' type:
recovering a fifth fragment of the first chunk of the peer group of chunks by employing a sixth fragment of the first chunk via a second chunk-level decoding operation, and
recovering a seventh fragment of the second chunk by employing an eighth fragment of the first chunk via a second zone-level decoding operation.

15. The method of claim 13, wherein the zone-level erasure coding scheme results in the peer group of chunks comprising $k_{zone}+m_{zone}$ chunks, and wherein the zone-level erasure coding scheme is selected from a group of erasure coding schema comprising a 12+4 erasure coding scheme, a 10+2 erasure coding scheme, and a 4+2 erasure coding scheme.

16. The method of claim 13, wherein the chunk-level erasure coding scheme results in chunks comprising $k_{chunk}+m_{chunk}$ fragments, and wherein the chunk-level erasure coding scheme is selected from a group of erasure coding schema comprising a 12+4 erasure coding scheme, a 10+2 erasure coding scheme, and a 4+2 erasure coding scheme.

17. The method of claim 13, wherein the determining that the indicator satisfies a condition related to continuing operations comprises:
determining that all data fragments of the peer group of chunks have been recovered,
determining that a subsequent iteration of the operations cannot complete because a count of available fragments is less than $k_{zone}$, resulting in prevention of completing a zone-level fragment recovery operation, or
determining that a subsequent iteration of the operations cannot complete because the count of available fragments is less than $k_{chunk}$, resulting in prevention of a chunk-level fragment recovery operation.

18. A non-transitory machine-readable medium, comprising executable instructions that, when executed by a processor, facilitate performance of operations, comprising:
an initial iteration of operations comprising:
determining a type of a first iteration of a recovery process to facilitate recovery of a portion of a peer group of chunks stored in a geographically diverse data storage system, wherein all chunks comprising the peer group of chunks employ a same chunk-level erasure coding scheme, and wherein the peer group of chunks employs a zone-level erasure coding scheme;
in response to the type being a 'zone-level decoding first' type:
recovering, via a first zone-level decoding operation, a first fragment of a first chunk of the peer group of chunks based at least in part on a second fragment of a second chunk of the peer group of chunks, wherein the second fragment corresponds to the first fragment, and
recovering, via a first chunk-level decoding operation, a third fragment of the first chunk based at least in part on a fourth fragment of the first chunk; and
performing a subsequent iteration of the operations after the initial iteration.

19. The non-transitory machine-readable medium of claim 18, wherein the initial iteration of operations further comprises:
in response to the type being a 'chunk-level decoding first' type:
recovering a fifth fragment of the first chunk of the peer group of chunks by employing a sixth fragment of the first chunk via a second chunk-level decoding operation, and
recovering a seventh fragment of the second chunk by employing an eighth fragment of the first chunk via a second zone-level decoding operation.

20. The non-transitory machine-readable medium of claim 18, wherein the zone-level erasure coding scheme results in the peer group of chunks comprising $k_{zone}+m_{zone}$ chunk, and wherein the chunk-level erasure coding scheme results in chunks comprising $k_{chunk}+m_{chunk}$ fragments.

* * * * *